United States Patent
Wang

(10) Patent No.: US 8,283,929 B2
(45) Date of Patent: Oct. 9, 2012

(54) METHOD AND APPARATUS TO MONITOR ELECTRIC ISOLATION OF A HIGH-VOLTAGE DIRECT CURRENT ELECTRICAL CIRCUIT

(75) Inventor: Konking (Michael) Wang, Canton, MI (US)

(73) Assignee: GM Global Technology Operations LLC, Detroit, MI (US)

(*) Notice: Subject to any disclaimer, the term of this patent is extended or adjusted under 35 U.S.C. 154(b) by 315 days.

(21) Appl. No.: 12/791,227

(22) Filed: Jun. 1, 2010

(65) Prior Publication Data

US 2011/0291662 A1   Dec. 1, 2011

(51) Int. Cl.
*G01R 31/02* (2006.01)

(52) U.S. Cl. .................... 324/537; 324/76.11; 324/500
(58) Field of Classification Search .................. None
See application file for complete search history.

(56) References Cited

U.S. PATENT DOCUMENTS

| | | | |
|---|---|---|---|
| 6,459,175 B1* | 10/2002 | Potega | 307/149 |
| 2010/0019930 A1* | 1/2010 | Biester et al. | 340/850 |

* cited by examiner

*Primary Examiner* — Jermele M Hollington
*Assistant Examiner* — Trung Nguyen

(57) ABSTRACT

An electrically isolated high-voltage direct-current electric circuit is monitored. Electrical signals are periodically sampled, and ground isolation indexes are calculated. A trend corresponding to trend elements is characterized. The characterized trend is compared with an expected trend with deviations indicative of potential faults.

15 Claims, 4 Drawing Sheets

METHOD AND APPARATUS TO MONITOR ELECTRIC ISOLATION OF A HIGH-VOLTAGE DIRECT CURRENT ELECTRICAL CIRCUIT

TECHNICAL FIELD

This disclosure is related to electric motor control circuits, and more specifically to monitoring electric motor control circuits.

BACKGROUND

The statements in this section merely provide background information related to the present disclosure and may not constitute prior art.

Electric machines include rotors that rotate in response to alternating current (AC) electric power applied to associated stators. The rotors can be mechanically coupled to power transmission devices to provide tractive power to a driveline of a vehicle.

Known voltage source inverters including rectifier bridge circuits and associated control circuits can convert direct current (DC) electric power originating from a high-voltage energy storage device to alternating current (AC) electric power to generate tractive power in response to operator requests. Known rectifier bridge circuits include MOSFET and IGBT switch devices. Electric load requirements can include presently occurring electric loads and battery charging to meet future electric loads.

A voltage source inverter uses a floating DC bus setup wherein the DC input voltages are configured to float with reference to a chassis ground. This floating can be controlled by using high impedance resistors that connect to the chassis ground. Capacitors can be electrically connected in parallel with the high impedance resistors to provide low impedance shunt paths for high frequency electric noise currents. In one embodiment, half the DC bus voltage is applied across a positive electric power bus DC(+) to the chassis ground, and half the DC bus voltage is applied across a negative electric power bus DC(−) to the chassis ground. An AC side of the voltage source inverter floats with reference to the chassis ground. When a ground isolation fault occurs on one of the phases of the AC side of the voltage source inverter, AC current associated with activation and deactivation of the switch devices of the inverter flows through the capacitors that provide the low impedance shunt paths for high frequency electric noise currents. In the event of a ground isolation fault, AC current associated with one of the phase voltages of the inverters from the positive electric power bus DC(+) to the negative electric power bus DC(−) can cause excessive electric current flow to the capacitors that provide the low impedance shunt paths for high frequency electric noise currents. AC current in excess of the capacity of the capacitors can cause capacitor faults and associated inverter damage.

A known solution to detect and thus prevent a ground isolation fault includes measuring electric current through each of the electric cables associated with the phases of the AC side of the voltage source inverter and arithmetically summing them. In an ideal system operating without a fault, the sum of the measured electric currents is zero at any selected point in time. When a ground isolation fault is present, the sum of the measured electric currents is a value other than zero. Issues associated with this solution include measurement errors associated with signal outputs from the electric current sensing devices, which can be cumulative. This can cause an error in the overall current signal. Furthermore, a phase current sensor can have bandwidth/step response limitations due to magnetic and electrical response characteristics and sensor saturation. Thus a fault may not be detected depending on the timing of the sample measurement in relation to switching events associated with the inverter. Furthermore, a ground isolation fault and associated change in impedance can include a resonance element, with data sampling occurring at or near a zero crossing. Thus, a fault current may be aliased out. Furthermore, when impedance approaches zero, any current oscillation may be dampened out in less than the sampling time. Thus the fault current may not be measured.

Another known solution to detect, mitigate and prevent ground isolation faults includes measuring voltage between the positive electric power bus DC (+) and the chassis ground, and measuring voltage between the negative electric power bus DC (−) and the chassis ground to detect a ground isolation fault. Issues associated with this known solution include measurement errors in the signals, which need to be accounted for and are often cumulative. Furthermore, known DC voltage sensors can have bandwidth and response time measurement limitations. Thus a fault may not be detected. Furthermore, the timing of the measurement sample relative to a fault and an associated switching event may result in a fault not being recorded. Furthermore, a fault impedance may include a resonance element, with data sampling occurring at or near the zero crossing. Thus, any fault current may be aliased out. Furthermore, when a switching period associated with the inverter is near a 50% duty cycle, an average voltage may still be near an expected level. Thus, a fault voltage may not be measured.

SUMMARY

An electrically isolated high-voltage direct-current electric circuit includes an electric energy storage device electrically connected via a positive DC electric power bus and a negative DC electric power bus to an electric load device. A method for monitoring the electric circuit includes monitoring the positive DC electric power bus and the negative DC electric power bus and an electric load associated with the electric machine, periodically sampling electrical signals associated with the positive DC electric power bus and the negative DC electric power bus and calculating respective ground isolation indexes based upon the periodically sampled electrical signals, calculating trend elements using successively calculated ground isolation indexes, characterizing a trend corresponding to the trend elements, comparing the characterized trend with an expected trend, the expected trend associated with the monitored electric load associated with the electric machine, and detecting a potential fault associated with electric isolation of the high-voltage direct-current electrical circuit when the characterized trend deviates from the expected trend.

BRIEF DESCRIPTION OF THE DRAWINGS

One or more embodiments will now be described, by way of example, with reference to the accompanying drawings, in which.

DETAILED DESCRIPTION

Figure 1:
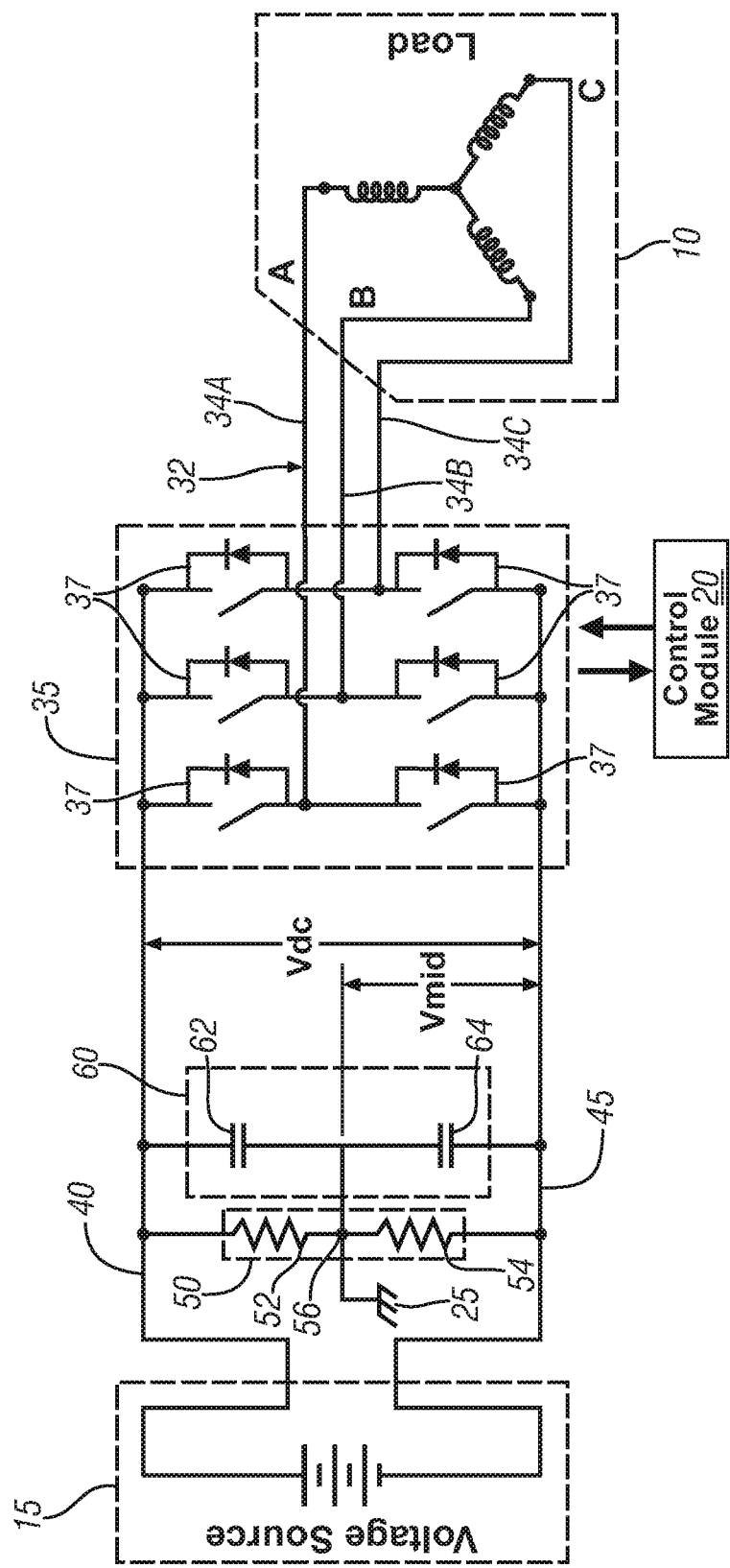
FIG. 1 schematically illustrates an electric motor control circuit including an inverter circuit configured to transfer and convert high-voltage direct-current (DC) electric power from an energy storage device to an electric load device in accordance with the present disclosure.

Referring now to the drawings, wherein the showings are for the purpose of illustrating certain exemplary embodiments only and not for the purpose of limiting the same, FIG. 1 schematically illustrates an electric circuit including a high-voltage energy storage device (Voltage Source) 15 electrically connected to an inverter circuit 35 via a positive DC electric power bus 40 and a negative DC electric power bus 45. The positive DC electric power bus 40 and negative DC electric power bus 45 transfer high-voltage direct-current (DC) electric power therebetween. The electric circuit depicted in FIG. 1 is meant to be illustrative and the concepts described herein are not limiting.

The inverter circuit 35 includes a rectifying bridge circuit that converts DC electric power from the high-voltage energy storage device 15 to high-voltage alternating current (AC) electric power that is transferred to an electric load (Load) 10, e.g., a multiphase electric machine 10. The inverter circuit 35 electrically connects to the electric machine 10 via an AC electric circuit 32 including a wiring harness including a plurality of electric cables 34A, 34B, and 34C, wherein the electric cables 34A, 34B, and 34C electrically connect to phases of the electric machine 10.

The electric machine 10 preferably includes a multiphase synchronous AC machine including a stator and a rotor magnetically coupled to the stator. As depicted, the electric machine 10 is a three-phase machine with electric phases A, B, and C. Alternatively, the electric machine 10 can include any one of a plurality of multiphase devices, e.g., two-phase, four-phase, five-phase devices, and a half-phase electric machine. In one embodiment the electric machine 10 is configured to generate torque that is transferred via a rotor to a driveline for a vehicle. Alternative applications will be apparent to one having ordinary skill in the art.

The inverter circuit 35 electrically connects to each of the phases A, B, and C of the electric machine 10. The inverter circuit 35 includes a plurality of switch devices 37, shown as three pairs of switch devices 37 associated with corresponding phases A, B, and C of the illustrated electric machine 10. Each of the switch devices 37 preferably includes a semiconductor device having low-on impedance, e.g., in an order of magnitude of milli-Ohms One exemplary switch device 37 includes a field-effect transistor device. In one embodiment this can be a MOSFET device. Alternatively, the switch devices 37 can include IGBT devices, JFET devices and other devices. The pairs of switch devices 37 are configured to control electric power flow between the positive DC electric power bus 40 and one of the plurality of electric cables 34A, 34B, and 34C of the AC electric circuit 32 associated with one of the phases A, B, and C of the electric machine 10, and the negative DC electric power bus 45. A control module 20 includes a switch control circuit to control activation and deactivation of each of the switch devices 37.

A resistor shunt circuit 50 includes first and second high impedance resistors 52 and 54 that are electrically connected in series between the positive DC electric power bus 40 and the negative DC electric power bus 45. Junction 56 between the first and second high impedance resistors 52 and 54 is electrically connected to a chassis ground 25. The high-voltage energy storage device 15 electrically connects to the positive DC electric power bus 40 and the negative DC electric power bus 45 such that the DC input voltages are electrically isolated from the chassis ground 25 and float with reference to the chassis ground 25. Ground isolation is controlled using the first and second high impedance resistors 52 and 54. Preferably, half the DC bus voltage is applied across the positive DC electric power bus 40 to the chassis ground 25, and half the DC bus voltage is applied across the negative DC electric power bus 45 to the chassis ground 25.

A capacitive shunt circuit 60 includes first and second high capacitors 62 and 64 that are electrically connected in series between the positive DC electric power bus 40 and the negative DC electric power bus 45 at junction 56. The capacitive shunt circuit 60 provides low impedance shunt paths for high frequency noise currents. The first and second capacitors 62 and 64 are precision capacitors preferably having equal capacitance ratings that are sized in conformance with electric power transferred between the positive DC electric power bus 40 and the negative DC electric power bus 45. In one embodiment the first and second capacitors 62 and 64 are rated at 2 μF, 10%, 1200V. The capacitive shunt circuit 60 is a snubber circuit intended to suppress transient electric voltage and current during ongoing operation. Voltage suppression can be accomplished by storing electric energy in the first and second capacitors 62 and 64 during one portion of an operating cycle and discharging the electric energy during a second portion of the operating cycle. Preferably each of the capacitors 62 and 64 are Y-capacitors that shunt common-mode electrical noise current. Known Y-capacitors contain a dielectric having self-healing properties to suppress and prevent current leakage therethrough and prevent an associated ground fault.

The control module 20 is configured to continuously monitor electric potentials and electric load associated with the electric circuit including the high-voltage energy storage device 15 electrically connected to the inverter circuit 35 via the positive and negative DC electric power buses 40 and 45. This includes monitoring the electric potential across the positive DC electric power bus 40 and the negative DC electric power bus 45, depicted as Vdc in FIG. 1. This includes monitoring the electric potential between the negative DC electric power bus 45 and the chassis ground 25, referred to herein as a midpoint voltage and depicted as Vmid in FIG. 1. Alternatively, this can include monitoring electric potential between the positive DC electric power bus 45 and the chassis ground 25. This includes monitoring a load current associated with electric current flow between the high-voltage energy storage device 15 and the electric machine 10 via the inverter circuit 35 and the positive and negative DC electric power buses 40 and 45 using known load monitoring devices and techniques.

Control module, module, controller, control unit, processor and similar terms mean any suitable one or various combinations of one or more of Application Specific Integrated Circuit(s) (ASIC), electronic circuit(s), central processing unit(s) (preferably microprocessor(s)) and associated memory and storage (read only, programmable read only, random access, hard drive, etc.) executing one or more software or firmware programs, combinational logic circuit(s), input/output circuit(s) and devices, appropriate signal conditioning and buffer circuitry, and other suitable components to provide the described functionality. The control module 20 has a set of control algorithms, including resident software program instructions and calibrations stored in memory and executed to provide the desired functions. The algorithms are preferably executed during preset loop cycles. Algorithms are executed, such as by a central processing unit, and are operable to monitor inputs from sensing devices and other networked control modules, and execute control and diagnostic routines to control operation of actuators. Loop cycles may be executed at regular intervals, for example each 3.125, 6.25, 12.5, 25 and 100 milliseconds during ongoing engine and vehicle operation. Alternatively, algorithms may be executed in response to occurrence of an event.

Figure 2:
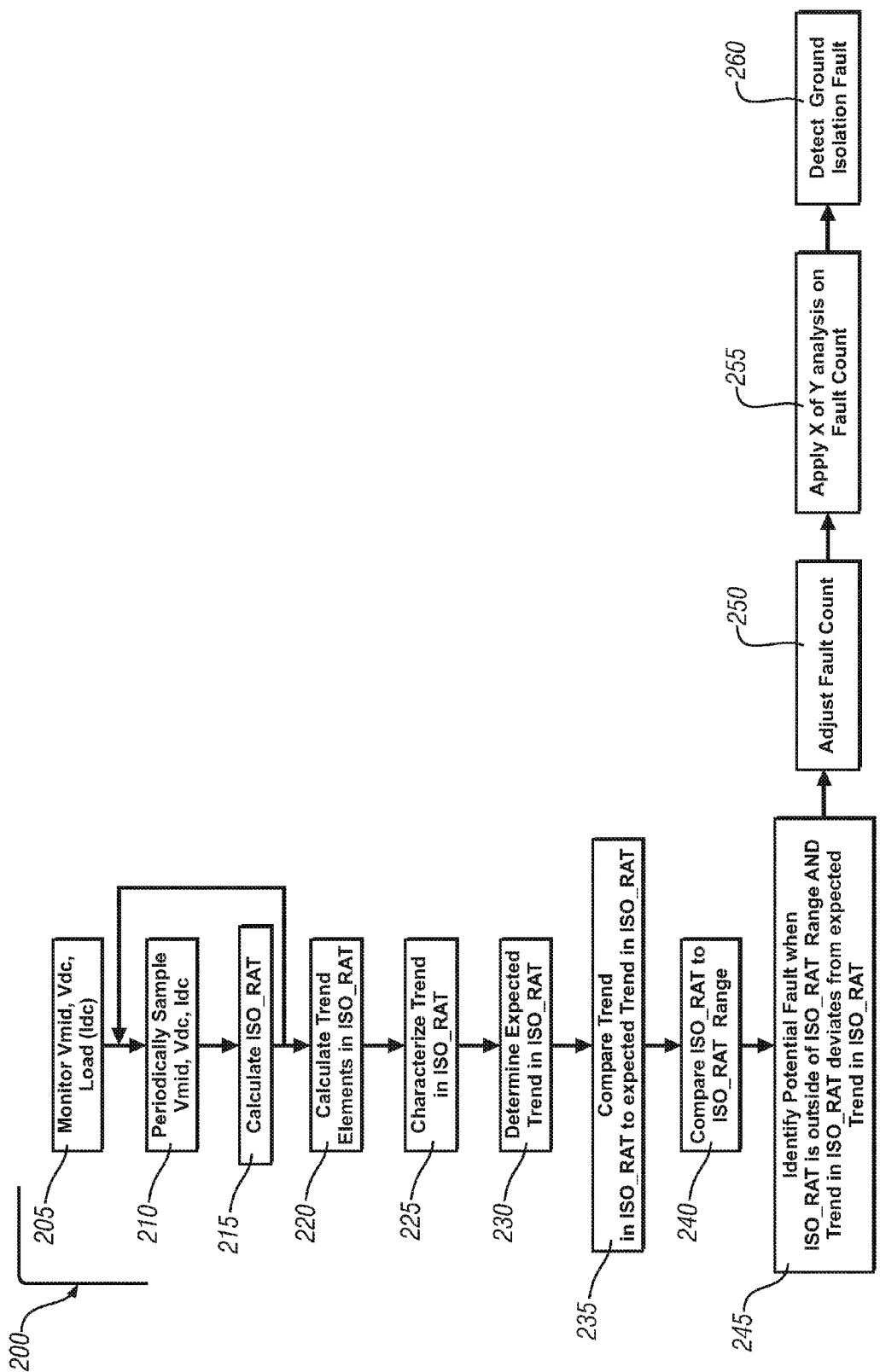
FIG. 2 depicts a flowchart to detect a loss of ground isolation of one of a positive DC electric power bus and a negative DC electric power bus in accordance with the present disclosure.

FIG. 2 depicts a flowchart 200, preferably executed in the control module 20 as program instructions, to detect a loss of ground isolation of one of the positive DC electric power bus 40 and the negative DC electric power bus 45 relative to the chassis ground 25. During ongoing operation, the electrical potential across the positive DC electric power bus 40 and the negative DC electric power bus 45 and an electric load of the electric machine 10 are continuously monitored, as previously described (205). In one embodiment this includes monitoring the midpoint voltage (Vmid) the electric potential across the positive DC electric power bus 40 and the negative DC electric power bus 45 (Vdc) and the load current (Idc).

The control module 20 periodically samples the monitored electric potentials and electric load associated with the electric circuit, i.e., samples voltages associated with the electrical potential across the positive DC electric power bus 40 and the negative DC electric power bus 45 and concurrently samples the associated electric load. In one embodiment this includes periodically sampling the midpoint voltage Vmid, the electric potential across the positive DC electric power bus 40 and the negative DC electric power bus 45 Vdc, and the load current Idc. Periodically sampling includes sampling at an appropriate rate, which can be a 1.0 msec sampling rate in one embodiment (210).

A ground isolation index is calculated for each successive sampling of the electric potentials and the electric load (215). In one embodiment the ground isolation index is an isolation ratio that is calculated for each of the aforementioned successive samples of the electric potentials and correlated to the electric load. Calculating the isolation ratio includes arithmetically comparing the electric potentials, i.e., comparing the voltage potentials across the positive DC electric power bus 40 and the negative DC electric power bus 45 Vdc with the midpoint voltage Vmid. In one embodiment the isolation ratio (ISO_RAT) is calculated as follows:

$$\text{ISO\_RAT} = (2 \times V\text{mid})/V\text{dc} \qquad [1]$$

Under ideal conditions with no ground isolation fault present, the isolation ratio has a value of 1.0 using Eq. 1. It is understood that the isolation ratio of Eq. 1 is illustrative. Equations other than the isolation ratio of Eq. 1 can be used to calculate a ground isolation index. As is appreciated by those skilled in the art, factors associated with system and operating conditions can cause variations to occur in the ground isolation index without a corresponding fault in the ground isolation of one of the positive DC electric power bus 40 and the negative DC electric power bus 45. Thus, an allowable range for the ground isolation index can be determined and associated with the aforementioned factors. In one embodiment, the allowable range for the ground isolation index is between 0.8 and 1.2.

A variation in the ground isolation index can include deviating outside the allowable range for the ground isolation index, which may indicate a ground isolation fault, although the indication is not conclusive. Other factors can affect the midpoint voltage Vmid relative to the electric potential Vdc, including an imbalance in leakage current in the high-voltage energy storage device 15 caused by a sudden change in the electric load through the electric machine 10, which may be indicated by the monitored load current Idc. A sudden change in the electric load can result when there is a change in demand for electric power through the electric machine 10. This may include an increase in demand for torque output from the electric machine 10 and an associated discharging of electric power from the high-voltage energy storage device 15. This may include an increase in demand for regenerative braking torque output from the electric machine 10 and an associated charging of electric power to the high-voltage energy storage device 15.

The flow chart 200 accounts for a deviation in the ground isolation index from the ideal ground isolation index associated with a sudden change in the electric load by calculating trend elements in successively calculated ground isolation indexes (220) and characterizing a trend in the ground isolation index using the trend elements (225). The electric load is preferably indicated by the monitored load current Idc, as previously described.

Calculating the trend elements and characterizing the trend in successively calculated ground isolation indexes includes using curve-fitting analysis of the ground isolation indexes. For a given dataset, y(t), e.g., sample points of successively calculated ground isolation indexes y[0], y[−1], and y[−2] can be curve-fitted by the following equation:

$$y(t) = K1 + K2 * \exp(-t/T), \text{ and } m(t) = dy(t)/dt = -K2/T * \exp(-t/T) \qquad [2]$$

which can be rewritten as follows:

$$y[i] = K1 + K2 * \exp(-i * T_{cal}/T), \text{ and } m[i] = -K2/T * \exp(-i * T_{cal}/T) \qquad [3]$$

wherein K1, K2, T are parameters used to fit y(t), y[i] and m[i] are discrete forms of y(t) and m(t), wherein T is a time constant and $T_{cal} \ll T$, with $T_{cal}$ as the time period used in the discretization, i.e., the data sampling rate. The following terms can be calculated.

$$m[0] = -K2/T \qquad [4]$$

$$m[-1] = m[0] * \exp(-T_{cal}/T) \approx m[0] * (1 T\text{cal}/T) \qquad [5]$$

$$T = m[-1]/(m[-1] - m[0]) * T\text{cal} \qquad [6]$$

$$K2 = -m[0] * T \qquad [7]$$

The values for T and K2 can be obtained from local information. Trend elements Q1, Q2, and Q3 can be calculated as follows using the sample points of successively calculated ground isolation indexes y[0], y[−1], and y[−2].

$$Q1 = 2 * y[-2] - y[0] - y[-1] \qquad [8]$$

$$Q2 = y[-1] - y[-2] \qquad [9]$$

$$Q3 = y[0] - y[-1] \qquad [10]$$

This yields the following for T and K2.

$$T = Q2/Q1 * T_{cal} \qquad [11]$$

$$K2 = -(Q3 + Q2)/2/T_{cal} * T \qquad [12]$$

Also, the time constant T has a maximum threshold value $T_{high}$ which is preferably substantially greater than expected values for time constant T. The maximum threshold value $T_{high}$ is introduced to avoid division used to calculate the time constant T.

The trend elements Q1, Q2, and Q3 are characterized into one of a plurality of trends, including Type 1, Type 2, Type 3, Type 4 and Type 5 trends. Each of the trends is associated with a change in magnitude, i.e., y-direction, of the isolation ratio as indicated by the successively calculated ground isolation indexes. The quantity of characterized trends is intended to be illustrative and not restrictive. The aforementioned trends are described as follows.

Overall, it is expected that the ground isolation index will remain unchanged or decrease when there is a change in the electric load associated with a demand for electric power through the electric machine 10 to generate tractive torque, i.e., an increase in the electric load corresponding to an increase in discharging of the high-voltage energy storage device 15. This corresponds to the Type 5 and Type 1 trends, respectively.

Overall, it is expected that the ground isolation index will remain unchanged or increase when there is a change in the electric load associated with a demand for electric power through the electric machine 10 to induce brake torque related to a regenerative braking operation, i.e., a decrease in the electric load corresponding to an increase in charging of the high-voltage energy storage device 15. This corresponds to the Type 5 and Type 2 trends, respectively.

Overall, it is expected that the ground isolation index will remain unchanged when there is no change in the electric load associated with a demand for electric power through the electric machine 10, i.e., no substantial change in either charging or discharging of the high-voltage energy storage device 15. This corresponds to the Type 5 trend.

The trend of the sample points of successively calculated ground isolation indexes y[0], y[−1], and y[−2] can be characterized as follows, using Eqs. 8, 9, 10, 11, and 12 to calculate the trend elements Q1, Q2, and Q3, and other factors.

A trend associated with Type 5 is characterized by abs(Q1*$T_{high}$)≦abs(Q2*$T_{cal}$), or abs(Q2+Q3)≦SlopeThreshold. Correspondingly, K2=0, and abs(T) is large as calculated using Eqs. 11 and 12, above.

A trend associated with Type 1 is characterized by (Q1>0) and (Q2>0) and (Q3+Q2)<0, or when (Q1<0) and (Q2<0) and (Q3+Q2)<0. Correspondingly, K2>0 and T>0 as calculated using Eqs. 11 and 12, above.

A trend associated with Type 2 is characterized by (Q1>0) and (Q2<0) and (Q3+Q2)>0, or when (Q1<0) and (Q2<0) and (Q3+Q2)>0. Correspondingly, K2<0 and T>0 as calculated using Eqs. 11 and 12, above.

A trend associated with Type 3 is characterized by (Q1>0) and (Q2<0) and (Q3+Q2)>0, or when (Q1<0) and (Q2>0) and (Q3+Q2)>0. Correspondingly, K2>0 and T<0 as calculated using Eqs. 11 and 12, above.

A trend associated with Type 4 is characterized by (Q1>0) and (Q2<0) and (Q3+Q2)<0, or when (Q1<0) and (Q2>0) and (Q3+Q2)<0. Correspondingly, K2<0 and T<0 as calculated using Eqs. 11 and 12, above.

Figure 4:
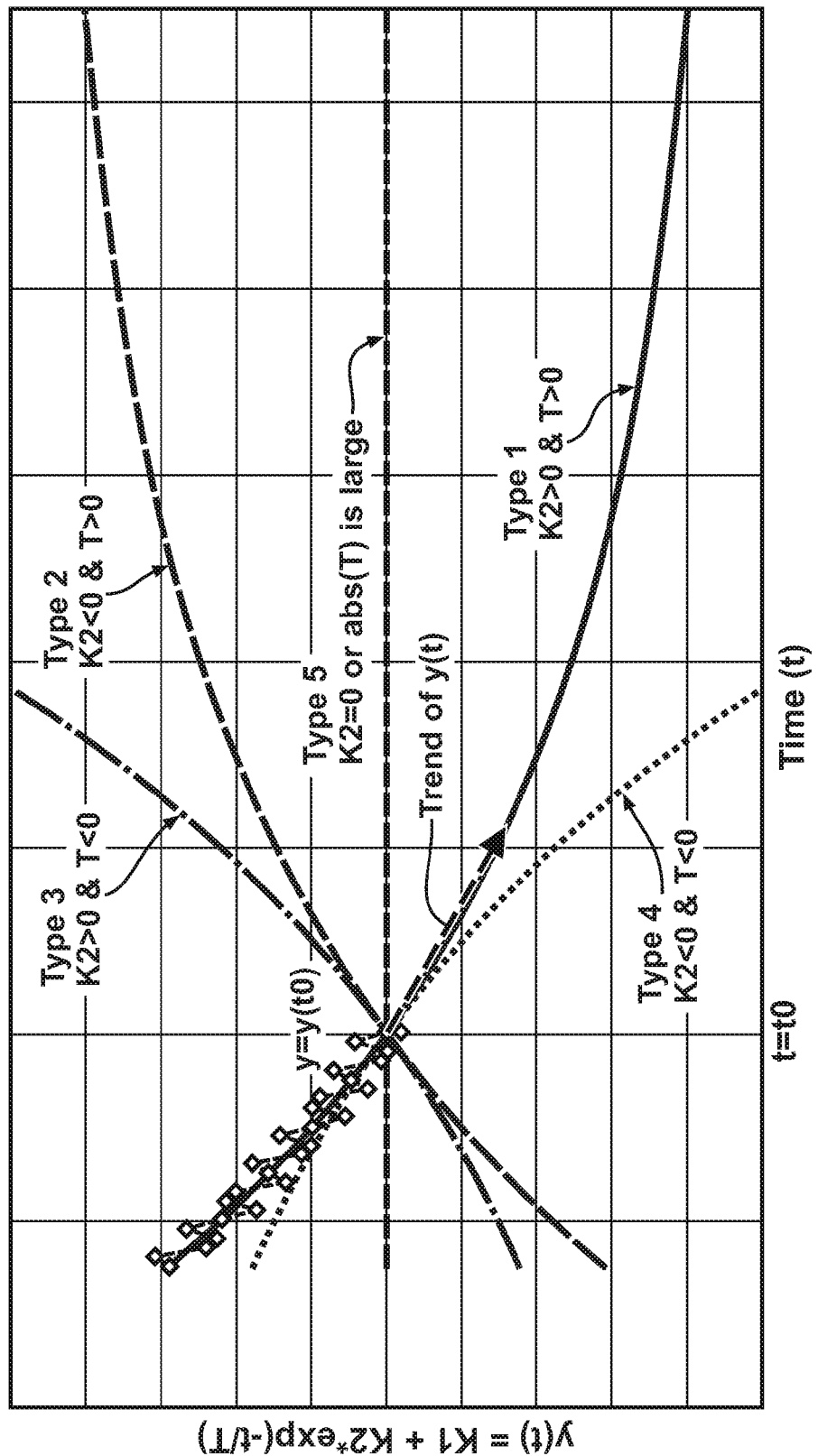
FIG. 4 is a datagraph depicting characteristics of sample points of successively calculated ground isolation indexes associated with Type 1, Type 2, Type 3, Type 4 and Type 5 trends in accordance with the present disclosure.

FIG. 4 is a datagraph depicting characteristics of y(t) associated with the aforementioned Type 1, Type 2, Type 3, Type 4 and Type 5 trends.

The trend of the sample points of successively calculated ground isolation indexes y[0], y[−1], and y[−2] is characterized as Type 1 when the trend elements indicate there is a disturbance wherein the ground isolation index is decreasing but stabilizing at some determinable state for the ground isolation index.

The trend of the sample points of successively calculated ground isolation indexes y[0], y[−1], and y[−2] is characterized as Type 2 when the trend elements indicate there is a disturbance wherein the isolation ratio is increasing but stabilizing at some determinable state for the isolation ratio.

The trend of the sample points of successively calculated ground isolation indexes y[0], y[−1], and y[−2] is characterized as Type 3 when the trend elements indicate there is a disturbance wherein the ground isolation index is increasing in an unstable manner.

The trend of the sample points of successively calculated ground isolation indexes y[0], y[−1], and y[−2] is characterized as Type 4 when the trend elements indicate there is a disturbance wherein the ground isolation index is decreasing in an unstable manner.

The trend of the sample points of successively calculated ground isolation indexes y[0], y[−1], and y[−2] is characterized as Type 5 when the trend elements indicate there is no present disturbance with the ground isolation index.

The characterized trend in the ground isolation index is analyzed with reference to an expected trend in the ground isolation index to identify a potential fault and detect presence of a ground isolation fault. This includes determining an expected trend in the ground isolation index associated with the electric load using the periodically sampled load currents Idc correlated to the successively calculated ground isolation indexes y[0], y[−1], and y[−2] (230). An expected trend in the ground isolation index can include 1) the magnitude of the ground isolation index is stable and unchanged when the electric load is relatively stable and unchanging; 2) the magnitude of the ground isolation index is changing in a positive direction when the electric load is increasing, e.g., an increase in discharging; and 3) the magnitude of the ground isolation index is changing in a negative direction when the electric load is decreasing, e.g., an increase in charging.

The characterized trend in the ground isolation index is analyzed with reference to the expected trend in the ground isolation index, which can be determined using the electric load (235). The calculated ground isolation index is compared to the allowable range in the ground isolation index, e.g., between 0.8 and 1.2 (240). A potential fault in the ground isolation index can be identified when the calculated ground isolation index is outside the allowable range for the ground isolation index and the characterized trend in the ground isolation index deviates from an expected trend in the ground isolation index (245).

A fault count is updated accordingly, which includes counting a quantity of observations and a quantity of faults associated with the observations (250). An X of Y analysis is conducted on the fault count (255). An X of Y analysis includes detecting a quantity of X faults that occur during Y observations. This can include faults representing X discrete observations over the previous Y successive discrete samplings of the electric potentials and electric load. This can include faults representing X seconds (elapsed time) of discrete observations over the previous Y seconds (elapsed time) of successive discrete samplings of the electric potentials and electric load. The X of Y analysis is preferably executed during ongoing operation using the successive discrete sampled data that is continually updated.

A fault associated with ground isolation can be detected when the X of Y analysis detects a quantity of X faults that occur during Y observations, with X exceeding a predetermined threshold (260). In one embodiment, the predetermined threshold can be 50% of Y, and thus a fault is identified when the quantity of X faults is greater than 50% of Y during Y observations. It is appreciated that the predetermined threshold can be another suitable threshold that is associated with observed faults in a specific embodiment, and the disclosure is not limited hereby.

Figure 3:
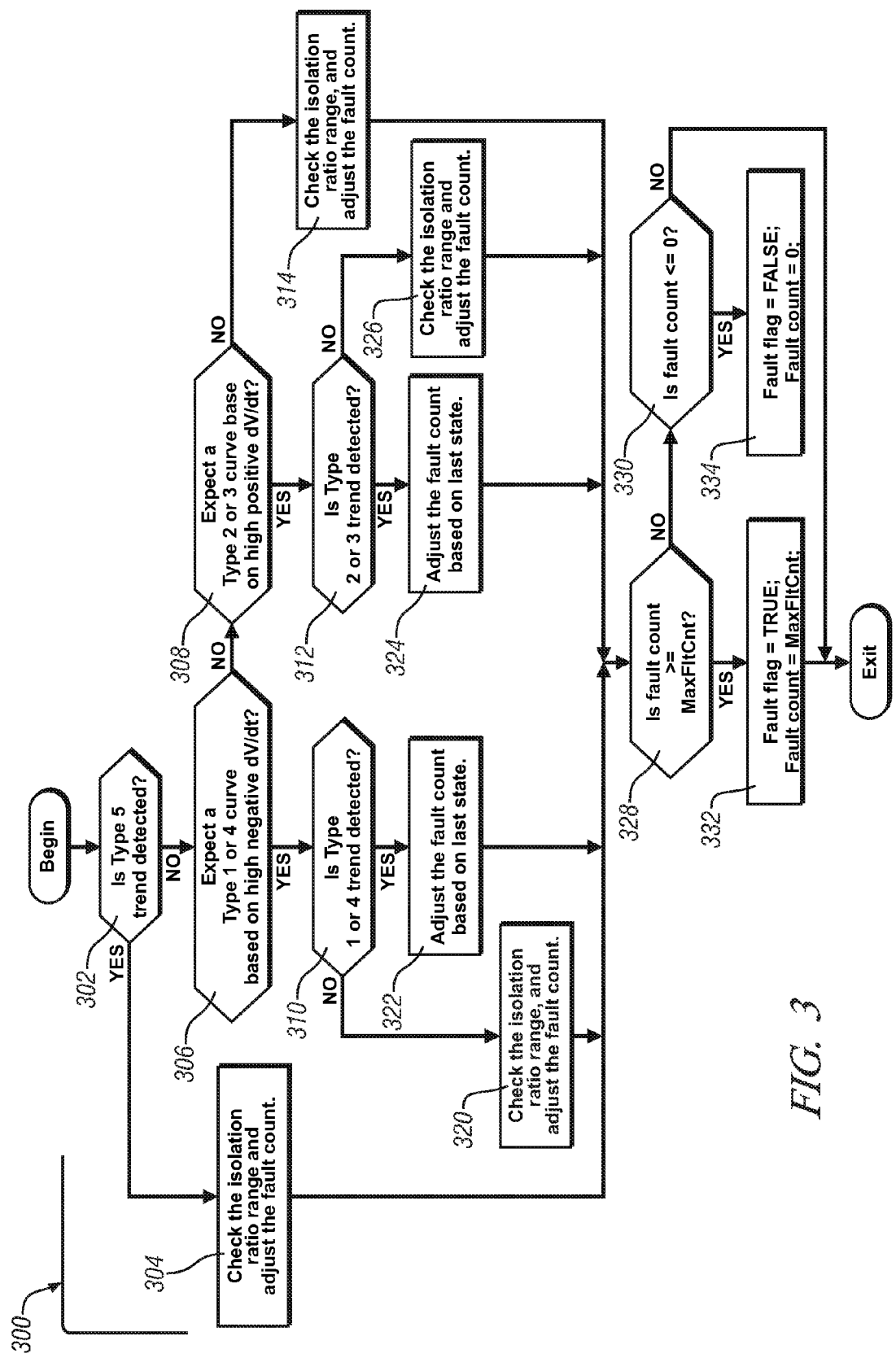
FIG. 3 depicts a flowchart of a process to analyze the characterized trend in the ground isolation index with reference to the expected trend in the ground isolation index in accordance with the present disclosure.

FIG. 3 depicts a process 300 that is preferably executed in the control module 20 as an program instructions to analyze the characterized trend in the ground isolation index with reference to the expected trend in the ground isolation index. In this embodiment, the expected trend in the ground isolation index is determined using the electric load, preferably including describing the load current Idc in terms of a direction and magnitude of change in the electric potential across the positive DC electric power bus 40 and the negative DC electric power bus 45, i.e., one of a positive and a negative dV/dt. Preferably, the process 300 is executed for each successively calculated ground isolation index during ongoing operation.

When a Type 5 trend is identified in the ground isolation index (302), the ground isolation index is compared to the allowable range for the ground isolation index and a fault count is adjusted accordingly (304).

When the direction and magnitude of change in the electric potential across the positive DC electric power bus 40 and the negative DC electric power bus 45 indicates that one of a Type 1 and a Type 4 trend (high negative dV/dt) is expected (306) and is correspondingly detected (310), the fault count is adjusted based upon the previous state of the ground isolation index (322).

When the direction and magnitude of change in the electric potential across the positive DC electric power bus 40 and the negative DC electric power bus 45 (high negative dV/dt) indicates that one of the Type 1 and Type 4 trends is expected (306) but is not correspondingly detected (310), the ground isolation index is compared to the allowable range for the ground isolation index and the fault count is adjusted accordingly (320).

When the direction and magnitude of change in the electric potential across the positive DC electric power bus 40 and the negative DC electric power bus 45 indicates that one of the Type 2 and Type 3 trends (high positive dV/dt) is expected (308) and is correspondingly detected (312), the fault count is adjusted based upon the previous state of the ground isolation index (324).

When the direction and magnitude of change in the electric potential across the positive DC electric power bus 40 and the negative DC electric power bus 45 (high positive dV/dt) indicates that one of the Type 2 and Type 3 trends is expected (308) but is not correspondingly detected (312), the ground isolation index is compared to the allowable range for the ground isolation index and the fault count is adjusted accordingly (326).

When the direction and magnitude of change in the electric potential across the positive DC electric power bus 40 and the negative DC electric power bus 45 indicates that none of the Type 1, Type 2, Type 3, and Type 4 trends is expected (314) the ground isolation index is compared to the allowable range for the ground isolation index and the fault count is adjusted accordingly (314).

The fault count associated with the ground isolation index is compared to a maximum or threshold fault count (328), and when it meets or exceeds the maximum fault count (MaxFltCnt), a fault flag is set (332). When the fault count associated with the ground isolation index is less than the maximum or threshold fault count (328), the fault count is compared to a zero value to assure the fault count is valid, i.e., positive (330). If the fault count is not valid, i.e., is negative or zero, then the fault count is reset to zero and the fault flag is reset (334). At this point, the analysis ends.

The disclosure has described certain preferred embodiments and modifications thereto. Further modifications and alterations may occur to others upon reading and understanding the specification. Therefore, it is intended that the disclosure not be limited to the particular embodiment(s) disclosed as the best mode contemplated for carrying out this disclosure, but that the disclosure will include all embodiments falling within the scope of the appended claims.

The invention claimed is:

1. Method for monitoring a high-voltage direct-current electrical circuit including an electric energy storage device electrically connected via a positive DC electric power bus and a negative DC electric power bus to an electric machine, the high-voltage direct-current electrical circuit electrically isolated from a chassis ground, the method comprising:
monitoring the positive DC electric power bus and the negative DC electric power bus and an electric load associated with the electric machine;
periodically sampling electrical signals associated with the positive DC electric power bus and the negative DC electric power bus and calculating respective ground isolation indexes based upon the periodically sampled electrical signals;
calculating trend elements using successively calculated ground isolation indexes;
characterizing a trend corresponding to the trend elements;
comparing the characterized trend with an expected trend, the expected trend associated with the monitored electric load associated with the electric machine; and
detecting a potential fault associated with electric isolation of the high-voltage direct-current electrical circuit when the characterized trend deviates from the expected trend.

2. The method of claim 1, wherein detecting the potential fault associated with electric isolation of the high-voltage direct-current electrical circuit comprises detecting the characterized trend indicates an increase in discharging of the high-voltage energy storage device and detecting the expected trend indicates charging of the high-voltage energy storage device.

3. The method of claim 1, wherein detecting the potential fault associated with electric isolation of the high-voltage direct-current electrical circuit comprises detecting the characterized trend indicates increase in charging of the high-voltage energy storage device and detecting the expected trend indicates discharging of the high-voltage energy storage device.

4. The method of claim 1, wherein calculating each respective ground isolation index based upon the periodically sampled electrical signals comprises:
sampling a respective first electric potential between the positive DC electric power bus and the negative DC electric power bus;
sampling a respective second electric potential between the negative DC electric power bus and the chassis ground; and
calculating the respective ground isolation index comprising a ratio of the respective first and second electric potentials.

5. The method of claim 1, wherein calculating the trend elements using successively calculated ground isolation indexes comprises calculating first, second and third trend elements using three successively calculated ground isolation indexes.

6. The method of claim 5, wherein the first trend element comprises an arithmetic difference between a first and a second of the three successively calculated ground isolation indexes.

7. The method of claim 5, wherein the second trend element comprises an arithmetic difference between the second and a third of the successively calculated ground isolation indexes.

8. The method of claim 1, wherein characterizing the trend corresponding to the trend elements comprises characterizing a first trend when the trend elements indicate the ground isolation index is decreasing but stabilizing at a first determinable state for the ground isolation index.

9. The method of claim 8, wherein characterizing the trend corresponding to the trend elements further comprises characterizing a second trend when the trend elements indicate the ground isolation index is increasing but stabilizing at a second determinable state for the ground isolation index.

10. The method of claim 9, wherein characterizing the trend corresponding to the trend elements further comprises characterizing a third trend when the trend elements indicate the ground isolation index is increasing in an unstable manner.

11. The method of claim 10, wherein characterizing the trend corresponding to the trend elements further comprises characterizing a fourth trend when the trend elements indicate the ground isolation index is decreasing in an unstable manner.

12. The method of claim 11, wherein characterizing a trend corresponding to the trend elements further comprises characterizing a fifth trend when the trend elements indicate the ground isolation index is stable.

13. Method for monitoring a high-voltage direct-current electrical circuit including an electric energy storage device electrically connected via a positive DC electric power bus and a negative DC electric power bus to an electric machine, the high-voltage direct-current electrical circuit electrically isolated from a chassis ground, the method comprising:
periodically sampling electrical potentials associated with the positive DC electric power bus and the negative DC electric power bus and a corresponding load current to the electric machine;
calculating a ground isolation index corresponding to each of the periodically sampled electrical potentials;
calculating trend elements using a plurality of successive ones of the ground isolation indexes;
characterizing a trend corresponding to the trend elements;
comparing the characterized trend with an expected trend that is based upon the load current to the electric machine; and
detecting a potential fault associated with electric isolation of the high-voltage direct-current electrical circuit when the characterized trend deviates from the expected trend.

14. Method for monitoring a high-voltage direct-current electrical circuit including an electric energy storage device electrically connected via a positive DC electric power bus and a negative DC electric power bus to an electric machine, the high-voltage direct-current electrical circuit electrically isolated from a chassis ground, the method comprising:
monitoring the positive DC electric power bus and the negative DC electric power bus and an electric load associated with the electric machine;
periodically sampling electrical signals associated with the positive DC electric power bus and the negative DC electric power bus and calculating respective ground isolation indexes comprising
sampling a first electric potential between the positive DC electric power bus and the negative DC electric power bus,
sampling a second electric potential between the negative DC electric power bus and the chassis ground, and
calculating a respective ground isolation index comprising a ratio of the first and second electric potentials;
calculating trend elements using three successively calculated ground isolation indexes including a first trend element comprising an arithmetic difference between a first and a second of the three successively calculated ground isolation indexes and a second trend element comprising an arithmetic difference between the second and a third of the successively calculated ground isolation indexes.
characterizing a trend corresponding to the trend elements;
comparing the characterized trend with an expected trend, the expected trend associated with the monitored electric load associated with the electric machine; and
detecting a potential fault associated with electric isolation of the high-voltage direct-current electrical circuit when the characterized trend deviates from the expected trend.

15. The method of claim 14, wherein characterizing the trend corresponding to the trend elements comprises characterizing the trend as one of
a first trend when the trend elements indicate the ground isolation indexes are decreasing but stabilizing at a first determinable state for the ground isolation index,
a second trend when the trend elements indicate the ground isolation indexes are increasing but stabilizing at a second determinable state for the ground isolation index,
a third trend when the trend elements indicate the ground isolation indexes are increasing in an unstable manner,
a fourth trend when the trend elements indicate the ground isolation indexes are decreasing in an unstable manner, and
a fifth trend when the trend elements indicate the ground isolation indexes are stable.

* * * * *